(12) United States Patent
Wang et al.

(10) Patent No.: US 6,944,640 B2
(45) Date of Patent: Sep. 13, 2005

(54) PROGRESSIVE TWO-DIMENSIONAL (2D) PYRAMID FILTER

(75) Inventors: Wen-Shan Wang, Chandler, AZ (US); Tinku Acharya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 10/039,434

(22) Filed: Dec. 28, 2001

(65) Prior Publication Data

US 2003/0126169 A1 Jul. 3, 2003

(51) Int. Cl.[7] .............................................. G06F 17/10
(52) U.S. Cl. .................................................... 708/300
(58) Field of Search .......................... 708/300, 301–323

(56) References Cited

U.S. PATENT DOCUMENTS 4,674,125 A * 6/1987 Carlson et al. ............. 708/313
6,304,679 B1 * 10/2001 Clingerman et al. ........ 708/300
6,438,567 B2 * 8/2002 Schollhorn .................. 708/313
6,650,688 B1 * 11/2003 Acharya et al. ............ 708/322
6,662,200 B2 * 12/2003 Acharya ..................... 708/319

* cited by examiner

*Primary Examiner*—Todd Ingberg
*Assistant Examiner*—Chat Do
(74) *Attorney, Agent, or Firm*—Robert D. Hinchliffe

(57) ABSTRACT

Implementations of a progressive two-dimensional pyramid filter bank are disclosed including a method of adding a first and a last input signal sample to a sum of input samples of a next lower-tap filter of a current filter to produce a sum of input signal samples for the current filter; and adding the sum of input signal samples for the current filter to an output signal sample of the next lower-tap filter of the current filter to produce an output signal sample for the current filter. In one implementation the first and second adding is performed by different adders. In another implementation the first and second adding is applied by column and by row.

9 Claims, 3 Drawing Sheets

| Implementations | | Traditional 2D-filter Bank | | Progressive 2D-filter Bank | |
|---|---|---|---|---|---|
| | | General | M = 5 | General | M = 5 |
| Software | # of additions | $2M^2 + 2M$ | 60 | $3M(M + 3)/2$ | 60 |
| | # of multiplications | $2M^2 + 4M$ | 70 | 0 | 0 |
| | # of computations | $4M^2 + 6M$ | 130 | $3M(M + 3)/2$ | 60 |
| Hardware | # of adders | $2M$ | 10 | $2(M + 1)$ | 12 |
| | # of multipliers | $2M$ | 10 | 0 | 0 |
| | # of clocks ** | $(4M + 1)$ | 21 | $(M + 1)$ | 6 |

1. Assume that the adder or multiplier finishes one computation by only one clock.
2. A MAC contains one adder and one multiplier.

FIG. 7

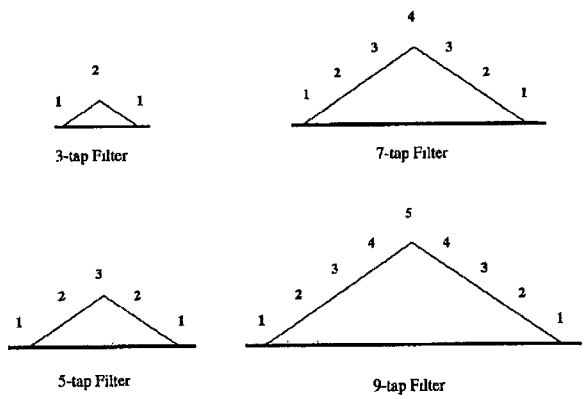

FIG. 1

| Filters/Input | Filter Coefficients (in gray boxes) | | | | | | | | | |
|---|---|---|---|---|---|---|---|---|---|---|
| F_3 |   |   |   |   | 1 | 2 | 1 |   |   |   |
| F_5 |   |   |   | 1 | 2 | 3 | 2 | 1 |   |   |
| F_7 |   |   | 1 | 2 | 3 | 4 | 3 | 2 | 1 |   |
| F_9 |   | 1 | 2 | 3 | 4 | 5 | 4 | 3 | 2 | 1 |
| F_11 | 1 | 2 | 3 | 4 | 5 | 6 | 5 | 4 | 3 | 2 |
| Input data | $D_{-5}$ | $D_{-4}$ | $D_{-3}$ | $D_{-2}$ | $D_{-1}$ | $D_0$ | $D_1$ | $D_2$ | $D_3$ | $D_4$ | $D_5$ |

| Filters/Input | 1D-filter outputs (sum of data in gray boxes in row) | | | | | | | | | |
|---|---|---|---|---|---|---|---|---|---|---|
| F_1 |   |   |   |   |   | $D_0$ |   |   |   |   |
| F_3 |   |   |   |   | $D_{-1}$ | $2D_0$ | $D_1$ |   |   |   |
| F_5 |   |   |   | $D_{-2}$ | $2D_{-1}$ | $3D_0$ | $2D_1$ | $D_2$ |   |   |
| F_7 |   |   | $D_{-3}$ | $2D_{-2}$ | $3D_{-1}$ | $4D_0$ | $3D_1$ | $2D_2$ | $D_3$ |   |
| F_9 |   | $D_{-4}$ | $2D_{-3}$ | $3D_{-2}$ | $4D_{-1}$ | $5D_0$ | $4D_1$ | $3D_2$ | $2D_3$ | $D_4$ |
| F_11 | $D_{-5}$ | $2D_{-4}$ | $3D_{-3}$ | $4D_{-2}$ | $5D_{-1}$ | $6D_0$ | $5D_1$ | $4D_2$ | $3D_3$ | $2D_4$ | $D_5$ |
| Input data | $D_{-5}$ | $D_{-4}$ | $D_{-3}$ | $D_{-2}$ | $D_{-1}$ | $D_0$ | $D_1$ | $D_2$ | $D_3$ | $D_4$ | $D_5$ |

| FIFO Name | ← ← Data pushed this way | | | | | | | | | |
|---|---|---|---|---|---|---|---|---|---|---|
| FIFO 3 | $K_{3,-5}$ | $K_{3,-4}$ | $K_{3,-3}$ | $K_{3,-2}$ | | | $K_{3,2}$ | $K_{3,3}$ | $K_{3,4}$ | $K_{3,5}$ |
| FIFO 5 | $K_{5,-5}$ | $K_{5,-4}$ | $K_{5,-3}$ | | | | | $K_{5,3}$ | $K_{5,4}$ | $K_{5,5}$ |
| FIFO 7 | $K_{7,-5}$ | $K_{7,-4}$ | | | | | | | $K_{7,4}$ | $K_{7,5}$ |
| FIFO 9 | $K_{9,-5}$ | | | | | | | | | $K_{9,5}$ |
| FIFO 11 | | | | | | | | | | |

PROGRESSIVE TWO-DIMENSIONAL (2D) PYRAMID FILTER

BACKGROUND

This disclosure is related to pyramid filter implementations.

A filter bank may comprise M different filters, where M is a finite number and larger than 1. Because the filter bank may generate M different output signal samples substantially simultaneously from the same input signal sample or samples, it allows the capability to select a desired signal sample output from M signal sample outputs in real-time. The application of a filter bank is, therefore, popular in reprographics systems, such as photocopying machines, for example. Unfortunately, since the computation of such a filter is complicated and the number of filters in a filter bank may also be large, the number of computations employed may be significant.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

FIG. 1 is a diagram illustrating the coefficients for one-dimensional (1D) pyramid filters;

FIG. 7 is a table comparing a traditional 2D filter bank with an embodiment of a progressive 2D filter bank.

DETAILED DESCRIPTION

Figures 2, 3, 6:
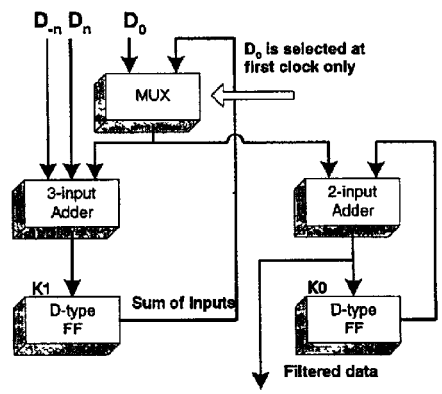
FIG. 2 is a table of filter coefficients for a 5-filter pyramid filter bank.
FIG. 3 is a table of input signal sample-filter coefficient products for a 5-filter pyramid filter bank.
FIG. 6 is a schematic diagram showing a portion of the embodiment of FIG. 5 in greater detail.

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail in order so as not to obscure the claimed subject matter.

An embodiment for an efficient implementation of a progressive pyramid 2D filter bank is presented. In this embodiment, the number of computations and the execution time is reduced over traditional two-dimensional (2D) pyramid filter bank implementations. Furthermore, hardware and software implementations of this particular embodiment are disclosed.

As is well-known, a pyramid filter is a special filter. Its coefficients form two arithmetic series and are symmetric to the center coefficient. For a one-dimensional finite pyramid filter with (2n−1) coefficients, its coefficients may be represented by a 1×(2n−1) matrix $[C_1, C_2, C_3, \ldots, C_{n-1}, C_n, C_{n-1}, \ldots, C_3, C_2, C_1]$; where, n is a positive integer and $C_2-C_1=C_3-C_2=\ldots=C_n-C_{n-1}$. For its corresponding two-dimensional separable filter, the coefficients may be represented by the product of a (2n−1)×1 and a 1×(2n−1) matrix using the elements from the one-dimensional filter.

Typically, a filter bank is comprised of a number of pyramid filters and their filter lengths are 3, 5, 7, 9, and so on. The coefficients of these filters also may have the following features:

1. All are positive integers.
2. The smallest coefficient is 1 and is the first and last coefficient in the coefficient series. The largest coefficient is dependent on the number of filter taps, or filter length, and is the center coefficient.
3. The difference between any two consecutive coefficients is 1.

FIG. 1 illustrates the coefficients of various one-dimensional pyramid filters in a filter bank. In this context, one-dimensional pyramid filters and two-dimensional separable pyramid filters are referred as 1D-filters, and 2D-filters, respectively.

The 1D-filter output signals, in the form of signal samples, is the product of its input data and filter coefficients. Eq. 1 and Eq. 2, below, respectively show how to compute the output signal samples of a 3-tap column and a 3-tape row 1D-filter, respectively. Eq. 3, below, shows how to compute the output signal samples of a 3-tap 2D-filter, designated $Y_{ij}$, by using a 2D-filter. Eq. 4, below, shows how to generate the output signals of a 3-tap 2D-filter output, designated $Z_{ij}$, by using, instead, two 1D-filters, one as a column filter and another as a row filter. This is possible because a 2D pyramid filter in this context comprises a separable function, which allows the computation of a 2D transformation in two operations, first by a row-wise 1D transformation of rows followed by a column-wise 1D transformation of columns, although the order of operations may also be reversed. Comparing $Z_{ij}$ with $Y_{ij}$, they are the same; however, applying a two-1D-filter scheme has the following advantages:

1. 1D-matrix multiplication is simpler than 2D-matrix multiplication.
2. 1D-column-filter output signal samples are reusable for the next 1D-row-filter computations.

Since the column-filter data is reusable, to compute an N×N filter involves computing one new column-filter from raw data and one row-filter from the column-filter output signal samples as long as the other previous (N−1) column-filter output signal samples exist. As described in more detail hereinafter, this makes computation easier.

$$Y_i = [a \ b \ a] \times \begin{bmatrix} S_{i-1} \\ S_i \\ S_{i+1} \end{bmatrix} = aS_{i-1} + bS_i + aS_{i+1} \quad (1)$$

$$Y_j = [S_{j-1} \ S_j \ S_{j+1}] \times \begin{bmatrix} a \\ b \\ a \end{bmatrix} = aS_{j-1} + bS_j + aS_{j+1} \quad (2)$$

$$Y_{i,j} = \begin{bmatrix} S_{i-1,j-1} & S_{i-1,j} & S_{i-1,j+1} \\ S_{i,j-1} & S_{i,j} & S_{i,j+1} \\ S_{i+1,j-1} & S_{i+1,j} & S_{i+1,j+1} \end{bmatrix} \otimes \left( \begin{bmatrix} a \\ b \\ a \end{bmatrix} \times [a \ b \ a] \right) = \begin{bmatrix} S_{i-1,j-1} & S_{i-1,j} & S_{i-1,j+1} \\ S_{i,j-1} & S_{i,j} & S_{i,j+1} \\ S_{i+1,j-1} & S_{i+1,j} & S_{i+1,j+1} \end{bmatrix} \otimes \begin{bmatrix} a^2 & ab & a^2 \\ ab & b^2 & ab \\ a^2 & ab & a^2 \end{bmatrix}$$

$$Y_{i,j} = [S_{i-1,j-1} \ S_{i-1,j} \ S_{i-1,j+1}] \times \begin{bmatrix} a^2 \\ ab \\ a^2 \end{bmatrix} + [S_{i,j-1} \ S_{i,j} \ S_{i,j+1}] \times \begin{bmatrix} ab \\ b^2 \\ ab \end{bmatrix} + [S_{i+1,j-1} \ S_{i+1,j} \ S_{i+1,j+1}] \times \begin{bmatrix} a^2 \\ ab \\ a^2 \end{bmatrix}$$

$$Y_{i,j} = a^2(S_{i-1,j-1} + S_{i-1,j+1} + S_{i+1,j-1} + S_{i+1,j+1}) + ab(S_{i-1,j} + S_{i,j-1} + S_{i,j+1} + S_{i+1,j}) + b^2 S_{i,j} \quad (3)$$

$$Z_{i,j} = [a \ b \ a] \times \begin{bmatrix} S_{i-1,j-1} & S_{i-1,j} & S_{i-1,j+1} \\ S_{i,j-1} & S_{i,j} & S_{i,j+1} \\ S_{i+1,j-1} & S_{i+1,j} & S_{i+1,j+1} \end{bmatrix} \times \begin{bmatrix} a \\ b \\ a \end{bmatrix}$$

$$Z_{i,j} = [aS_{i-1,j-1} + bS_{i,j-1} + aS_{i+1,j-1} \quad aS_{i-1,j} + bS_{i,j} + aS_{i+1,j} \quad aS_{i-1,j+1} + bS_{i,j+1} + aS_{i+1,j+1}] \times \begin{bmatrix} a \\ b \\ a \end{bmatrix}$$

$$Z_{i,j} = a^2(S_{i-1,j-1} + S_{i-1,j+1} + S_{i+1,j-1} + S_{i+1,j+1}) + ab(S_{i-1,j} + S_{i,j-1} + S_{i,j+1} + S_{i+1,j}) + b^2 S_{i,j} \quad (4)$$

A traditional 2D-filtering scheme will typically use multiplication and addition, for software implementation, or a multiplier-and-accumulator (MAC), for hardware implementation, to implement column and row-filter computations.

Generally, a filter bank with M output signal samples has N=2M+1 input signal samples or coefficients. Here, the coefficients of a N-tap 1D-filter are denoted $C_1, C_2, \ldots C_N$, the input data are denoted $D_1, D_2, \ldots D_N$, the column-filter data are denoted $K_1, K_2, \ldots K_N$, and the 2D output signal samples are denoted $O_N$. In accordance with the description above, to get 2D-filter output data or signal samples, one column-filter output signal sample, $K_N$, and one row-filter output signal sample, $O_N$, are computed from the previous column-filter output signal samples, $K_1, K_2, \ldots K_{N-1}$. For example, 1. Column filter:
   Let $K_N = C_1 \times D_1 + C_2 \times D_2 \ldots C_N \times D_N$ and push or store $K_N$ in a
   FIFO, such as one designated FIFO N in this example.
2. Row filter:
   Let $O_N = C_1 \times K_1 + C_2 \times K_2 \ldots C_N \times K_N$ and output signal samples
   $O_N$.

From this approach, an N-tap column-filter employs N multiplications and N−1 additions, for a software implementation, or one MAC in (2N−1) clocks, for a hardware implementation, with the assumption that the MAC takes two clocks to do one multiplication and one addition. The operations of row-filters are similar to that of the column-filter. Therefore, this doubles the number of software computations or hardware MACs, depending upon the implementation, in order to get 2D-filter output data, which is the row filter output signal samples.

Thus, for an implementation in software, a 3-tap 2D-filter employs 6 multiplications and 4 additions, a 5-tap 2D-filter employs 10 multiplications and 8 additions, and so on. Totally, the filter bank with M filters, thus, employs, for this embodiment:

6+10+14+ . . . +2(2M+1)=2M²+4M multiplications, and
4+8+12+ . . . +2(2M+1−1)=2M²+2M additions.

For an implementation in hardware, a N-tap filter employs 2 MACs and (2N−1) clocks to produce the desired output signal samples for a 2D-filter. Totally, the filter bank with M filters, thus, employs, for this embodiment:

2M MACs, with a MAC containing one multiplier and one 2-input adder, and
2(2M+1)−1=(4M+1) clocks, which is also the number of clocks for the largest-tap filter, N=(2M+1), because all MACs can compute substantially simultaneously.

In alternative embodiments, it may also be possible to reduce the number of MACs but it will increase the number of clocks. Although the hardware embodiments discussed are those that execute in the smallest number of clock cycles, the claimed subject matter is not limited in scope in this respect.

FIG. 2 provides the coefficients for a filter bank with 5 filters. The input data for separated filters is also listed. The number of input samples for such a filter is equal to the number of coefficients of that filter. An input data or signal sample and its corresponding coefficient are put in the same column in FIG. 2. For example, for the F_7, the input data is $[D_{-3}, D_{-2}, D_{-1}, D_0, D_1, D_2, D_3]$ and the corresponding coefficients are [1, 2, 3, 4, 3, 2, 1]. According to the Eqs. 1 or 2, the 1D-filtered data are the sum of products of an input data and its corresponding coefficient. In a shadowed box of FIG. 3, there is a single product of input data and coefficient. To get the filter output signal sample, add up the input-coefficient-products in a row of the table. For example, the output signal sample of F_7 is $(D_{-3}+2D_{-2}+3D_{-1}+4D_0+3D_1+2D_2+D_3)$.

On one particular embodiment, he observation above regarding FIG. 3 provides a technique for producing the input and output signal samples of an individual filter by the following rules:

1. Assume there is virtual filter, F_1, whose output signal sample is the input signal sample, $D_0$.
2. The sum of input signal samples of a filter is obtained by adding its first and last input signal samples to the sum of input samples of its next lower-tap filter.

3. The output signal sample of a filter is the sum of its input signal samples and the output signal sample of its next lower-tap filter.

For example, the sum of input signal samples of F_3 is $(D_{-1}, +D_0, +D_1)$, the output signal sample of F_3 is $(D_{-1}+2D_0+D_1)$, and the first and last input signal samples of F_5 are $D_{-2}$ and $D_2$. From rule 2, the sum of input signal samples of F_5 is $(D_{-2}+D_{-1}+D_0+D_1+D_2)$, and then, from rule 3, the output signal sample of F_5 is $(1D_{-2}+2D_{-1}+3D_0+2D_1+1D_2)$.

Based on the rules just mentioned, computing becomes straight-forward by computing the filter output signal sample from the lowest-tap filter and progressing to the next higher-tap filters. As described in more detail hereinafter, a filter bank with 5 filters is used to demonstrate how to compute the output signal samples of the 1D-filters, although this is merely an example and does not limit the scope of the claimed subject matter. For example, assume $K_{3,F}$ and $S_3$ are, respectively, the output signal sample for column F and sum of the input signal samples of F_3, $K_{5,F}$ and $S_5$ are, respectively, the output signal sample for column F and sum of input signal samples of F_5, and so on. Example pseudo code of a column-filter is as follows:

ColumnFilter(F)
Begin//totally, 15 additions are employed.
   Let $K_{1,F}=D_0$ and $S_3=D_{-1}+D_0+D_1$;
   Get $K_{3,F}=K_{1,F}+S_3$ and $S_5=D_{-2}+S_3+D_2$;
   Get $K_{5,F}=K_{3,F}+S_5$ and $S_7=D_{-3}+S_5+D_3$;
   Get $K_{7,F}=K_{5,F}+S_7$ and $S_9=D_{-4}+S_7+D_4$;
   Get $K_{11,F}=K_{9,F}+S_{11}$;
End From above, the column-filter data for column 5, $K_{3,F}$, $K_{5,F}$, $K_{7,F}$, $K_{9,F}$, and $K_{11,F}$, is obtained by fifteen additions, for software, or one 2-input adder and one 3-input adder in six clocks, for hardware. The above data for a filter bank with M filters leads to M output signal samples by:

(3×M) additions, for a software implementation, or
   One 2-input adder and one 3-input adder in (M+1) clocks, for a hardware implementation.

In one particular embodiment, $K_{N,F}$ are pushed into separated FIFOs as described in more detail hereinafter, although, of course, the claimed subject matter is limited in scope in this respect. For example, the contents of FIFOs, after completing 11 columns of raw data, are listed in FIG. 4. The FIFOs are employed to store data relevant to the filters, although, in alternative embodiments, other storage techniques or hardware may be employed other than FIFOs. For example, FIFO 3 in the table is for filter F_3, FIFO 5 is for F_5, and so on.

Figures 4, 5:
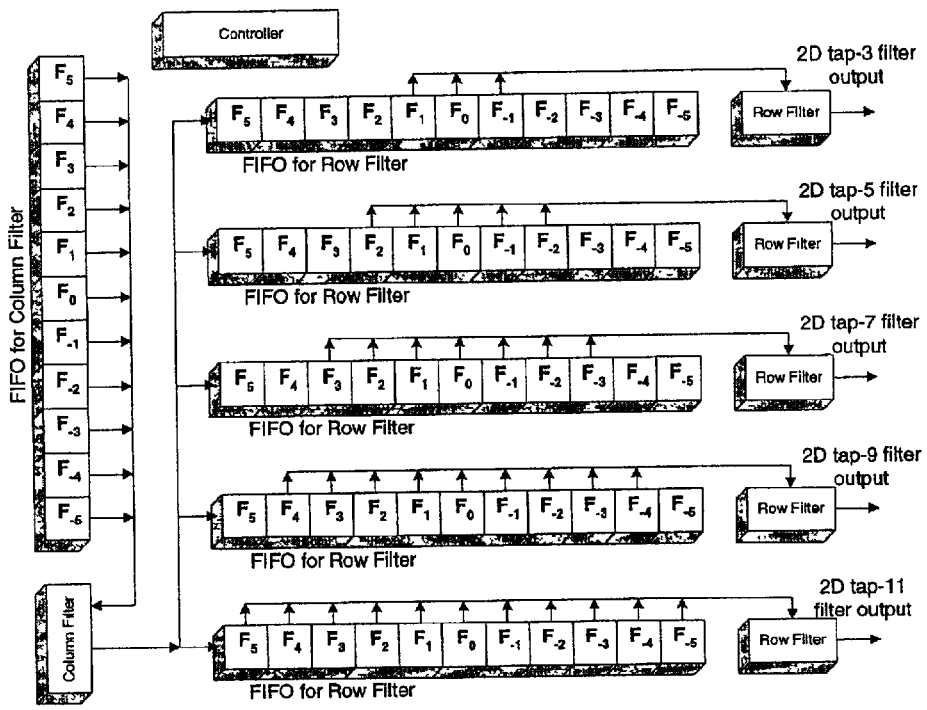
FIG. 4 is a table of column filter data for an embodiment of a 5-filter progressive pyramid filter bank.
FIG. 5 is a schematic diagram of an embodiment of a 5-filter two-dimensional (2D) progressive pyramid filter bank.

As described in more detail hereinafter, the $K_{N,F}$ will be passed, in this embodiment, to dedicated row filters for producing the 2D-filter output signal samples, although, again, the claimed subject matter is not limited in scope in this respect. For example, it is not necessary that dedicated row filters be employed. The computations for the row-filter are similar to that for the column-filter. However, unlike for the column-filter, the N-tap row-filter computes the center N data in thr FIFO. For example, the 3-tap row-filter employs $[K_{3,-1}, K_{3,0}, K_{3,1}]$. Because an N-tap filter employs N input signal samples around the center, input signal samples beyond that range are ignored in this embodiment. This is depicted in FIG. 4 through the use of shading.

Assume $O_3$ and $O_5$ are 2D-output signal samples from 3-tap and 5-tap row-filters, respectively. Example pseudo code to produce these signal samples is provided below. For the other tap row-filters, output signal samples may be derived similarly:

RowFilter (N)
Begin
  swithch(N)
  {
  case 3://3 additions in total
    Let $O_3=K_{3,0}$ and $S_3=K_{3,-1}+K_{3,0}+K_{3,1}$;
    Get $O_3=O_3+S_3$; break;
  case 5://6 additions in total
    Let $O_5=K_{5,0}$ and $S_5=K_{5,-1}+K_{5,0}+K_{5,1}$;
    Get $O_5=O_5S_5$ and $S_5=K_{5,-2}K_{5,0}K_{5,2}$;
    Get $O_5=O_5S_5$; break;
  case 7: . . . .
  case 9: . . . .
  . . . .
  }
End.

Therefore, for a software implementation of a filter bank with M filters, the row-filters employ (3×1+3×2+ . . . +3×M)=3M(M+1)/2 additions and the column-filter employs (3×M) additions. In total, 3M(M+3)/2 additions are employed in order to get M 2D-filter data for (2M+1)×(2M+1) matrix input signal samples. For a hardware implementation, a column or row filter contains a 2-input adder and a 3-input adder. Thus, the data of one column and M row-filters may be computed concurrently because they are independent from each other. In the other words, the total clocks employed for a filter bank with M filters may be the same as the number of clocks employed for the longest-tap filter, for example, the F_11 in the example above. Therefore, a hardware implementation may employ:

1. (M+1) column and row filters, a filter containing one 2adder and one 3-input adder.
2. (M+1) clocks to compute M 2D-filter output signal samples for (2M+1)×(2M+1) matrix input signal samples.

With the approach of the previously described embodiment, the computation for 2D-filter bank becomes relatively straight-forward. One possible software implementation is explained below in the form of pseudo-code, although, this is just an example, and the claimed subject matter is not limited in scope to this implementation. The progressive 2D-filter bank scheme is illustrated for this embodiment by the italics. In order to easily explain the pseudo-code, assume there are M filters in filter bank and the filter taps are 3, 5, . . . and (2M+1), respectively.

Begin
Set M=number of filters in filter bank;
Input (2M+1) rows of raw data and save them in buffer;
do{
  Set K=the number of columns of raw data;
  for(n=0; n<(2M+1); n++) ColumnFiter(n); //compute 1$^{st}$ (2M+1) column-filters
  do{
    RowFilter(3); //compute M 2D-filter output signal samples for 1 pixel.
    RowFilte(5);
    . . . .
    RowFilter(2M+1);
    ColumnFilter(n++); //compute next column-filter for next M 2D-filter output signal samples
  }while(n<K); //repeat until complete all columns (all 2D-filter outputs in row)
  Discard the 1$^{st}$ row data in the buffer;

Input one new row of raw data, save it as the last row data in the buffer;
} while (not last row); //repeat until complete all rows
End.

FIG. 5 shows a block diagram of an embodiment of a progressive 2D-filter bank with 5 filters. The unit names of column and row FIFOs are [$F_5$, $F_4$, $F_3$, $F_2$, $F_1$, $F_0$, $F_{-1}$, $F_{-2}$, $F_{-3}$, $F_{-4}$, $F_{-5}$]. The units with the same names but in different FIFOs contain different data. The detail of the controller is not shown in order not to obscure the claimed subject matter; however, in this embodiment, the controller is able to make the FIFOs and column raw data array repeat the following pattern:

1. $1^{st}$ clock: output data in $F_{-1}$, $F_0$, and $F_1$.
2. $2^{nd}$ clock: output data in $F_{-2}$, and $F_2$,
3. $3^{rd}$ clock: output data in $F_{-3}$, and $F_3$,
4. . . . and so on.

The circuitry in column filter and row filters are similar but the 3-tap row-filter outputs data at the $2^{nd}$ clock, the 5-tap row-filter outputs data at the $3^{rd}$ clock, and so on. The column-filter pushes its output data to FIFO-3 at the $2^{nd}$ clock, to FIFO-5 at the 3rd clock and so on. The diagram of one possible embodiment of a column filter or row filter is shown in FIG. 6, where $D_n$ represents the data output from the unit $F_n$ in FIFO and n is an integer between −5 and 5. Of course, the claimed subject matter is not limited in scope to the a-column or row filter embodiment shown.

The previously described embodiment of a 2D-filter scheme for a pyramid filter bank has several advantages over the traditional 2D-filter in terms of the number of computations and computing speed for software and hardware implementations. Referring to FIG. 7, the advantages of the progressive scheme for filter bank include the following:

Reduced number of computations: For a software implementation, the previously described embodiment of a progressive 2D-filter bank reduces the numbers of computations. For example, the reducing ratio is about 2:1 (130:60) if M=5;

Increased computing speed: For a software implementation, the previously described embodiment of a progressive 2D-filter bank utilizes less time to calculate because of both a fewer number of computations and because additions are employed instead of multiplications. For a hardware implementation, its execution time is about one quarter (6:21) of that for the traditional one if M=5;

Reduction in number of gates: For a hardware implementation of a filter, the gate count of a multiplier is larger than that of an adder. As indicated, therefore, the previously described embodiment of a progressive 2D-filter may avoid using multipliers or multiplication and reduce gate count.

It will, of course, be understood that, although particular embodiments have just been described, the claimed subject matter is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the claimed subject matter is not limited in scope in this respect, one embodiment may comprise an article, such as a storage medium. Such a storage medium, such as, for example, a CD-ROM, or a disk, may have stored thereon instructions, which when executed by a system, such as a computer system or platform, or a computing system, for example, may result in an embodiment of a method in accordance with the claimed subject matter being executed, such as an embodiment of a method of filtering pixel data, for example, as previously described. For example, an image processing platform or an image processing system may include an image processing unit, an image or video input/output device and/or memory.

While certain features of the claimed subject matter have been illustrated and described herein, many modifications, substitutions, changes and equivalents will now occur to those skilled in the art. It is, therefore, to be understood that the appended claims are intended to cover all such modifications and changes as fall within the true spirit of the claimed subject matter.

What is claimed is:

1. A method of implementing a two-dimensional pyramid filter bank comprising:

first adding a first and a last input signal sample to a sum of input samples of a next lower-tap filter of a current filter to produce a sum of input signal samples for the current filter; and second adding the sum of input signal samples for the current filter to an output signal sample of the next lower-tap filter of the current filter to produce an output signal sample for the current filter, wherein the first and second adding is performed by different adders and is applied by column and by row.

2. The method of claim 1, wherein the column and the row adding is performed independently.

3. The method of claim 1, wherein the first and second adding is performed progressively.

4. An article comprising: a storage medium, said storage medium having stored thereon instructions, that, when executed result in;

first adding a first and a last input signal sample to a sum of input samples of a next lower-tap filter of a current two-dimensional pyramid filter bank to produce a sum of input signal samples for the current filter; and second adding the sum of input signal samples for the current filter to an output signal sample of the next lower-tap filter of the current filter to produce an output signal sample for the current filter, the first and second adding being performed by different adders, the first and second adding being applied by column and by row.

5. The article of claim 4, wherein the instructions, when executed, further result in the column and the row adding being performed independently.

6. The article of claim 4, wherein the instructions, when executed, further result in the first and second adding being performed progressively.

7. An integrated circuit comprising: digital logic circuit components coupled so that, during operation, a first and a last input signal sample are added to a sum of input samples of a next lower-tap filter of a current filter to produce a sum of input signal samples for the current filter and so that the sum of input signal samples for the current filter are added to an output signal sample of the next lower-tap filter of the current filter to produce an output signal sample for the current filter, wherein the digital logic components include a multiplexer, two flip-flops, a two-input adder and a three-input adder.

8. The integrated circuit of claim 7, wherein, during operation, the current filter comprises a two-dimensional pyramid filter bank and the adding is applied by column and by row.

9. The integrated circuit of claim 8, wherein, during operation, the column and the row adding is performed independently.

* * * * *